(12) United States Patent
Wei et al.

(10) Patent No.: US 11,876,082 B1
(45) Date of Patent: Jan. 16, 2024

(54) BACKLIGHT CIRCUIT, DISPLAYING DEVICE AND DISPLAYING DRIVING METHOD

(71) Applicant: HKC CORPORATION LIMITED, Shenzhen (CN)

(72) Inventors: Guangping Wei, Shenzhen (CN); Yaohui Qin, Shenzhen (CN); Yiyao Xu, Shenzhen (CN); Caiyu Song, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/348,226

(22) Filed: Jul. 6, 2023

(30) Foreign Application Priority Data

Feb. 27, 2023 (CN) .......................... 202310168188.X (51) Int. Cl.
| | |
|---|---|
| *H01L 25/00* | (2006.01) |
| *H01L 25/075* | (2006.01) |
| *G02F 1/13357* | (2006.01) |
| *H01L 33/40* | (2010.01) |
| *H01L 25/16* | (2023.01) |

(52) U.S. Cl.
CPC .... *H01L 25/0753* (2013.01); *G02F 1/133603* (2013.01); *G02F 1/133604* (2013.01); *H01L 25/167* (2013.01); *H01L 33/405* (2013.01)

(58) Field of Classification Search
CPC ......... G02F 1/133603; G02F 1/133604; H01L 33/405; H01L 25/0753; H01L 25/167
See application file for complete search history.

(56) References Cited

U.S. PATENT DOCUMENTS

| | | |
|---|---|---|
| 6,295,107 B1 | 9/2001 | Watanabe et al. |
| 2015/0096877 A1 | 4/2015 | Chu et al. |
| 2015/0129869 A1* | 5/2015 | Wang ...................... H01L 33/32 257/43 |
| 2016/0356943 A1 | 12/2016 | Choi et al. |
| 2018/0130432 A1 | 5/2018 | Cui et al. |
| 2018/0348577 A1* | 12/2018 | Pousthomis ...... G02F 1/133514 |

(Continued)

FOREIGN PATENT DOCUMENTS

| | | |
|---|---|---|
| CN | 105929602 | 9/2016 |
| CN | 106292092 | 1/2017 |

(Continued)

*Primary Examiner* — Gerald J Sufleta, II
(74) *Attorney, Agent, or Firm* — Hodgson Russ LLP (57) ABSTRACT

A backlight circuit includes a lamp panel and a plurality of electron microscope assemblies. The lamp panel includes a driving substrate and a plurality of light-emitting chips on one side of the driving substrate. The electron microscope assemblies are disposed on first sides, away from the driving substrate, of the light-emitting chips in a one-to-one correspondence manner. Each electron microscope assembly includes a transparent electrode shield, an electrolyte, and an electrode plate. The transparent electrode shields are disposed on a first side of the driving substrate. The light-emitting chips are positioned in the transparent electrode shields. The electrode plates are disposed on first sides, away from the driving substrate, of the transparent electrode shields. The electrolytes are filled between the transparent electrode shields and the electrode plates.

19 Claims, 4 Drawing Sheets

(56) References Cited

U.S. PATENT DOCUMENTS

2019/0115507 A1\*  4/2019  Kim .................. H10K 50/82
2021/0278712 A1    9/2021  Tang et al.
2023/0077691 A1\*  3/2023  Zhu .................. H01L 33/382
                                                            257/634

FOREIGN PATENT DOCUMENTS

| | | |
|---|---|---|
| CN | 108169948 | 6/2018 |
| CN | 108628037 | 10/2018 |
| CN | 109073921 | 12/2018 |
| CN | 109143635 | 1/2019 |
| CN | 109581748 | 4/2019 |
| CN | 109709738 | 5/2019 |
| CN | 110412809 | 11/2019 |
| CN | 110824771 | 2/2020 |
| CN | 210534493 | 5/2020 |
| CN | 111474747 | 7/2020 |
| CN | 113325632 | 8/2021 |
| CN | 214174773 | 9/2021 |
| CN | 114007342 | 2/2022 |
| CN | 115113450 | 9/2022 |
| CN | 218181284 | 12/2022 |
| CN | 115663008 | 1/2023 |
| JP | H11142819 | 5/1999 |
| JP | 2001210122 | 8/2001 |
| JP | 2004086145 | 3/2004 |
| JP | 2007206373 | 8/2007 |
| JP | 2020118739 | 8/2020 |
| JP | 2021039314 | 3/2021 |
| KR | 20170049802 | 5/2017 |
| WO | 2021242245 | 12/2021 |
| WO | 2023272546 | 1/2023 |

\* cited by examiner

BACKLIGHT CIRCUIT, DISPLAYING DEVICE AND DISPLAYING DRIVING METHOD

CROSS-REFERENCE TO RELATED APPLICATIONS

This application claims priority to Chinese Patent Application No. 202310168188X, filed Feb. 27, 2023, the entire disclosure of which is incorporated herein by reference.

TECHNICAL FIELD

The present disclosure belongs to the field of displaying, and particularly relates to a backlight circuit, a displaying device, and a displaying driving method.

BACKGROUND

A liquid crystal display (LCD) panel is advantageous in good image quality, wide viewing angle, small size, light weight, low power consumption and low cost, thus being widely used in the field of flat panel displaying.

The LCD panel has a wider viewing angle, which can bring users a better visual experience. However, sometimes users also hope that the viewing angle of the LCD panel can be adjusted to be narrow to realize peep proofness, so as to effectively protect business secrets and personal privacy.

At present, the switching between the wide and narrow viewing angles of the LCD panel is mainly realized by dual cells, the conversion between a peep-proof mode and a shared mode of a display is carried out by means of the properties of transparency when a PDLC (Polymer Dispersed Liquid Crystal) is powered on and scattering when the PDLC is powered off, or the peep proofness of the panel is realized through tiny and dense gratings by adding a grating-like device outside a displaying panel or inside a backlight circuit.

SUMMARY

There are provided a backlight circuit, a displaying device, and a displaying driving method, according to embodiments of the present disclosure. The technical solution is as below:

According to a first aspect of the present disclosure, there is provided a backlight circuit, the backlight circuit includes a lamp panel, the lamp panel includes a driving substrate and a plurality of light-emitting chips, the plurality of light-emitting chips are disposed on one side of the driving substrate at intervals, the backlight circuit further includes a plurality of electron microscope assemblies, and the electron microscope assemblies are disposed on light-emitting sides of the light-emitting chips in a one-to-one correspondence manner;

the electron microscope assemblies include transparent electrode shields, electrolytes, and electrode plates, the transparent electrode shields are disposed on a first side of the driving substrate, the light-emitting chips are positioned in the transparent electrode shields, the electrode plates are disposed on sides, away from the driving substrate, of the transparent electrode shields, the electrolytes are filled between the transparent electrode shields and the electrode plates, and the electrolytes contain metal ions;

first electric fields or second electric fields are capable of being formed between the transparent electrode shields and the electrode plates, and the directions of the first electric fields are opposite to those of the second electric fields;

under the action of the first electric fields, the metal ions of the electrolytes are capable of forming first metal reflective films on the surfaces of the electrode plates, and light emitted from the light-emitting chips is reflected by the first metal reflective films, such that divergent light is emitted toward the driving substrate; and under the action of the second electric fields, the metal ions of the electrolytes are capable of forming second metal reflective films on the surfaces of the transparent electrode shields, and light emitted from the light-emitting chips is reflected by the second metal reflective films, such that parallel collimated light is emitted toward the driving substrate.

According to a second aspect of the present disclosure, there is provided a displaying device, including:

a backlight circuit; and an LCD panel disposed on a second side of the driving substrate, where the second side of the driving substrate is disposed opposite to a first side of the driving substrate.

According to a third aspect of the present disclosure, there is provided displaying driving method. The displaying driving method is configured to drive the displaying device. The displaying device at least includes a peep-proof displaying mode and a shared displaying mode. The displaying driving method includes:

in the peep-proof displaying mode, controlling corresponding pixels in the LCD panel to be in a light transmission state according to front displaying information, and controlling a first electric field to be formed between the transparent electrode shield and the electrode plate of each of the electron microscope assemblies; and in the shared displaying mode, controlling corresponding pixels in the LCD panel to be in a light transmission state according to the front displaying information, and controlling a second electric field to be formed between the transparent electrode shield and the electrode plate of each of the electron microscope assemblies.

Other features and advantages of the present disclosure will be become apparent from the following detailed description, or may be learned in part by practice of the present disclosure.

It should be understood that both the foregoing general description and the following detailed description are exemplary and explanatory only and are not intended to limit the present disclosure.

BRIEF DESCRIPTION OF THE DRAWINGS

The accompanying drawings here, which are incorporated in and constitute a part of the description, illustrate embodiments consistent with the present disclosure and, together with the description, serve to explain the principles of the present disclosure. Obviously, the accompanying drawings described below are only some embodiments of the present disclosure, and those of ordinary skill in the art can also obtain other accompanying drawings according to these accompanying drawings without creative work.

DETAILED DESCRIPTION OF THE EMBODIMENTS

Exemplary embodiments will now be described more thoroughly with reference to the accompanying drawings. The exemplary embodiments are capable, however, of being embodied in many forms and should not be construed as limited to the exemplars set forth herein; rather, providing these embodiments makes the present disclosure more thorough and complete, and the concept of the exemplary embodiments will be fully conveyed to those skilled in the art.

Furthermore, the described features, structures, or characteristics may be combined in any suitable manner in one or more embodiments. In the following description, numerous specific details are provided to give a sufficient understanding of embodiments of the present disclosure. However, one skilled in the art will recognize that the technical solutions of the present disclosure may be practiced without one or more of the specific details, or other methods, components, devices, steps, etc. may be employed. In other instances, well-known methods, devices, implementations, or operations are not shown or described in detail to avoid obscuring aspects of the present disclosure.

The present disclosure is described in further detail below with reference to the accompanying drawings and specific embodiments. It should be noted here that the technical features involved in each embodiment of the present disclosure described below may be combined with each other as long as they do not conflict with each other. The embodiments described below with reference to the accompanying drawings are exemplary and are intended to explain the present disclosure and are not to be construed as limiting the present disclosure.

Embodiment 1

Figure 1:
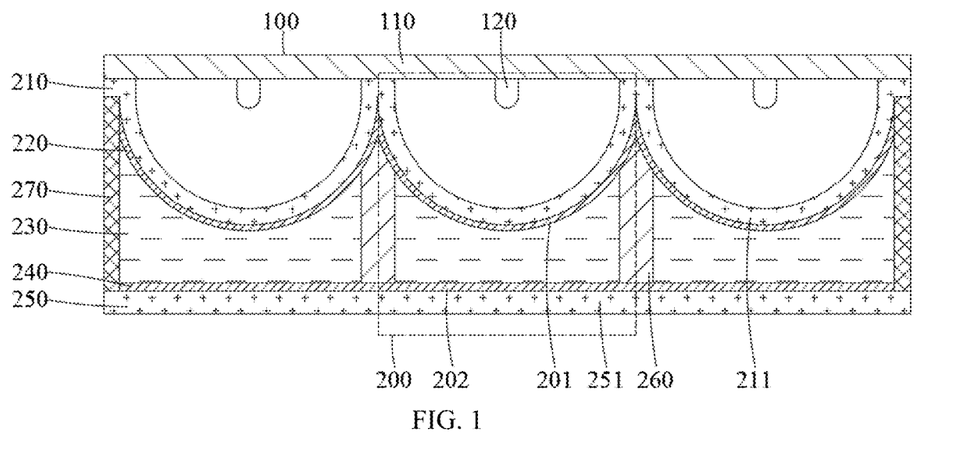
FIG. 1 is a schematic structural diagram of a backlight circuit according to an Embodiment 1 of the present disclosure.

Referring to FIG. 1, a backlight circuit in the embodiment includes a lamp panel 100 and a plurality of electron microscope assemblies 200.

The lamp panel 100 includes a driving substrate 110 and a plurality of light-emitting chips 120, where the plurality of light-emitting chips 120 are disposed on one side of the driving substrate 110 at intervals.

The electron microscope assemblies 200 correspond to the light-emitting chips 120 one by one, and are disposed on sides (that is, light-emitting sides), away from the driving substrate 110, of the light-emitting chips 120. The electron microscope assemblies 200 include transparent electrode shields 201, electrolytes 230 and electrode plates 202, where the transparent electrode shields 201 are disposed on a first side of the driving substrate 110, the light-emitting chips 120 are positioned in the transparent electrode shields 201, the electrode plates 202 are disposed on sides, away from the driving substrate 110, of the transparent electrodes shields 201, and the electrolytes 230 are filled between the transparent electrode shields 201 and the electrode plates 202. Both the transparent electrode shields 201 and the electrode plates 202 are transparent conductive structural parts.

Metal ions including silver ions and/or zinc ions are dissolved in the electrolytes 230, and metal films formed by depositing the metal ions have a high reflectivity. In the electron microscope assemblies 200, the transparent electrode shields 201 may serve as upper electrodes, and the electrode plates 202 may serve as lower electrodes. First electric fields or second electric fields are capable of being formed between the transparent electrode shields 201 and the electrode plates 202, and the directions of the first electric fields are opposite to those of the second electric fields.

When a positive voltage is applied to the transparent electrode shields 201 and a negative voltage is applied to the electrode plates 202 to form first electric fields, the metal ions in the electrolytes 230 form first metal reflective films on the surfaces of the electrode plates 202 under the action of the first electric fields, and light emitted from the light-emitting chip 120 is reflected by the first metal reflective films, such that divergent light is emitted toward the driving substrate 110. When a negative voltage is applied to the transparent electrode shields 201 and a positive voltage is applied to the electrode plates 202 to form second electric fields, the metal ions in the electrolytes 230 form second metal reflective films on the outer surfaces of the transparent electrode shields 201 under the action of the second electric fields, and light emitted from the light-emitting chips 120 is reflected by the second metal reflective films, such that parallel collimated light is emitted toward the driving substrate 110.

Figure 2:
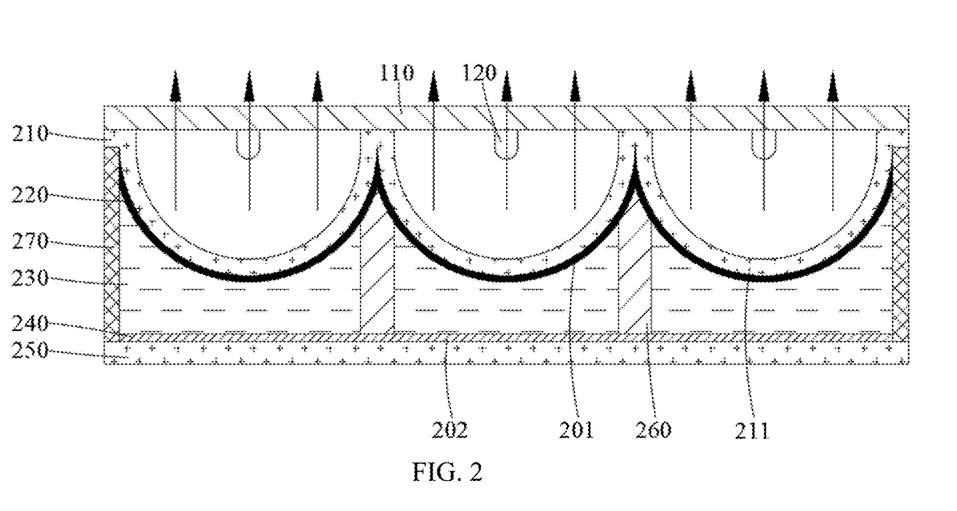
FIG. 2 is a schematic diagram of a backlight circuit in a peep-proof displaying mode according to an embodiment of the present disclosure.

Referring to FIG. 2, when the backlight circuit is in a peep-proof displaying mode, a negative voltage is applied to the transparent electrode shields 201 and a positive voltage is applied to the electrode plates 202, and the metal ions in the electrolytes 230 form second metal reflective films on the outer surfaces of the transparent electrode shields 201. At this time, light emitted downward from the light-emitting chips 120 will be propagated according to the principle of the shortest route, and is reflected by the metal reflective films formed on the surfaces of the cup-shaped transparent electrode shields 201, such that parallel collimated light is emitted upward, and after the collimated light is emitted from the LCD panel, a displayed image can be seen only in a front view, and the displayed image cannot be seen in a squint view, so that the peep-proof displaying effect is achieved.

Figure 3:
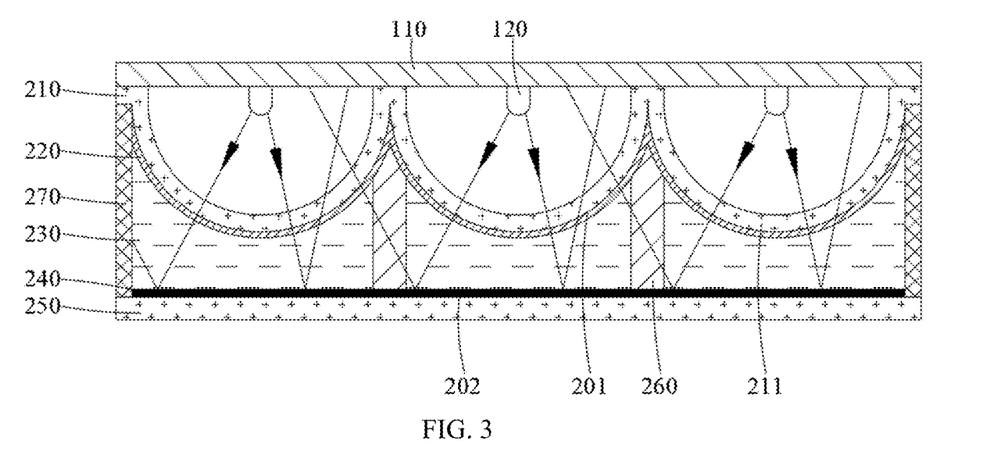
FIG. 3 is a schematic diagram of a backlight circuit in a shared displaying mode according to an embodiment of the present disclosure.

Referring to FIG. 3, when the backlight circuit is switched from the peep-proof displaying mode to the shared displaying mode, the polarities of the voltages applied between the transparent electrode shields 201 and the electrode plates 202 may be switched, that is, a positive voltage is applied to the transparent electrode shields 201 and a negative voltage is applied to the electrode plates 202. The second metal reflective films on the surfaces of the transparent electrode shields 201 will lose electrons and become metal ions to return to the electrolytes 230 again, and the metal ions will form the first metal reflective films on the surfaces of the electrode plates 202 with the continuous action of the electric fields. At this time, light emitted downward from the light-emitting chips 120 will pass through the transparent electrode shields 201 that transmit light, and is reflected by the first metal reflective films on the surfaces of the electrode plates 202 to be propagated upward in the form of a surface light source. The emitted light is scattered light emitted from all directions, and the displayed image can be seen in a front view or a squint view after the scattered light is emitted from the LCD panel.

In the embodiment, the plurality of light-emitting chips 120 are disposed on one side of the driving substrate 110 at intervals, the electron microscope assemblies 200 correspond to the light-emitting chips 120 one by one and are disposed on sides, away from the driving substrate 110, of the light-emitting chips 120, the electron microscope assemblies 200 include transparent electrode shields 201, electrolytes 230, and electrode plates 202, the transparent electrode shields 201 are disposed on one side of the driving substrate 110, the light-emitting chips 120 are positioned in the transparent electrode shields 201, the electrode plates 202 are disposed on sides, away from the driving substrate 110, of the transparent electrode shields 201, and the electrolytes 230 are filled between the transparent electrode shields 201 and the electrode plates 202. By switching the polarities of voltages of the transparent electrode shields 201 and the electrode plates 202, the metal ions in the electrolytes 230 may be controlled to form metal reflective films on the surfaces of the transparent electrode shields 201 or the electrode plates 202, and then the light emitted downward from the light-emitting chips 120 is reflected as collimated light or scattered light, thereby realizing the switching between the peep-proof displaying mode and the shared displaying mode.

In the embodiment, the switching between the peep-proof displaying mode and the shared displaying mode is realized by switching the light emitted from the backlight circuit into collimated light or the scattered light through the electron microscope assemblies 200. Light emitted from the backlight circuit is not blocked and absorbed. Compared with the technical solution of realizing peep proofness by adopting dual cells, a peep-proof film and the like, the utilization rate of the light emitted from the backlight circuit is increased. In addition, the use of dual cells or a peep-proof film to realize peep proofness will also reduce the transmittance of the LCD panel and increase the thickness of the LCD panel. Compared with the technical solution of realizing peep proofness by adopting the dual cells and the peep-proof film, the technical solution of the embodiment also improves the transmittance of the LCD panel.

In some embodiments, the light-emitting chip 120 may be an LED (light-emitting diode), a Mini LED, or a Micro LED chip, and light emitted from the light-emitting chip may be white light, red light, blue light, or green light. The size of the Mini LED chip is 50 micrometers to 200 micrometers, and when the Mini LED chip is bound on the driving substrate 110, a gap between two adjacent Mini LED chips is 0.3 millimeters to 1.2 millimeters. The size of the Micro LED chip is less than 50 micrometers, and when the Micro LED chip is bound on the driving substrate 110, a gap between two adjacent Micro LED chips is less than 0.3 millimeters.

The Mini LED/Micro LED chip is small in size, the gap between the chips is small, and the number of chips integrated on the driving substrate 110 is large, so that the chips may be divided into more fine backlight subareas, thereby greatly improving the contrast of the screen.

Referring to FIG. 1, the surfaces, facing the electrode plates 202, of the transparent electrode shields 201 are hemispherical surfaces or parabolic surfaces, and the positions of the light-emitting chips 120 coincide with the focus positions of the transparent electrode shields 201.

When the surfaces, facing the electrode plates 202, of the transparent electrode shields 201 are hemispherical surfaces or parabolic surfaces, and the positions of the light-emitting chips 120 coincide with the focus positions of the transparent electrode shields 201, the collimated light reflected by the transparent electrode shields 201 has a better convergence effect.

It should be noted that the surfaces, facing the electrode plates 202, of the transparent electrode shields 201 are hemispherical surfaces or parabolic surfaces, but is not limited to this. The transparent electrode shields 201 may also be of another irregular cup-shaped structure as long as the transparent electrode shields 201 can collect light. The positions of the light-emitting chips 120 may coincide with the focus positions of the transparent electrode shields 201, but is not limited to this. The positions of the light-emitting chips 120 may also deviate from the focus positions of the transparent electrode shields 201, so that only the light reflected by the transparent electrode shields 201 is slightly scattered, thereby increasing the peep-proof angle, as the case may be.

For example, referring to FIG. 1, the transparent electrode shields 201 include transparent shield bodies and first transparent conductive films 220, the light-emitting chips 120 are positioned in the transparent shield bodies, and the first transparent conductive films 220 cover the surfaces, facing the electrode plates 202, of the transparent shield bodies. The surfaces, facing the electrode plates 202, of the transparent shield bodies are hemispherical surfaces or parabolic surfaces. The electrode plates 202 include transparent matrices 251 and second transparent conductive films 240 formed on sides, facing the transparent electrode shields 201, of the transparent matrices 251, where the second transparent conductive films 240 may be disposed on the transparent electrode shields 201 in a one-to-one correspondence manner. The electrolytes 230 are filled between the first transparent conductive films 220 and the second transparent conductive films 240. The first transparent conductive films 220 and the second transparent conductive films 240 may both be indium tin oxide (ITO) films. The electrolytes 230 are a solution of metal ions such as silver ions and zinc ions.

Both The first transparent conductive films 220 and the second transparent conductive films 240 are indium tin oxide (ITO) films, and the indium tin oxide has excellent transparency and conductivity. The transparent electrode shields 201 include transparent shield bodies and first transparent conductive films 220, where the first transparent conductive films 220 cover the surfaces, facing the electrode plates 202, of the transparent shield bodies, and the electrode plates 202 include transparent matrices 251 and second transparent conductive films 240 formed on sides, facing the transparent electrode shields 201, of the transparent matrices 251. In such a design, the maintenance of the gaps between the first transparent conductive films 220 and the second transparent conductive films 240 is facilitated to form a more stable electric field.

Referring to FIG. 1, the backlight circuit includes a first transparent substrate 210, a second transparent substrate 250, first transparent conductive films 220, second transparent conductive films 240, electrolytes 230, and a frame 270. The first transparent substrate 210 is provided with a plurality of convex areas 211 and a planar area 212 other than the convex areas 211, and a structure corresponding to each convex area 211 forms one transparent shield body.

The second transparent substrate 250 is positioned on one side, away from the light-emitting chips 120, of the first transparent substrate 210, and areas, corresponding to the convex areas 211, of the second transparent substrate 250 are defined as the transparent matrices 251. The first transparent substrate 210 and the second transparent substrate 250 may both be glass substrates or transparent plastic substrates. That is to say, the electron microscope assemblies 200 include convex areas 211, a part of the first transparent conductive films 220 corresponding to the convex areas 211, a part of the electrolytes 230 corresponding to the convex areas 211, transparent matrices 251, and a part of the second transparent conductive films 240 corresponding to the transparent matrices 251, as shown by a dashed box in FIG. 1.

It should be noted that the backlight circuit includes a plurality of electron microscope assemblies 200, and the plurality of electron microscope assemblies 200 may be connected as a whole, but not limited to this. Each electron microscope assembly 200 may also be configured as an independent circuit, as the case may be.

The first transparent conductive films 220 may be formed on the surfaces of the convex areas 211, but is not limited to this. The whole surfaces of the first transparent conductive films 220 may also be formed on one side of the first transparent substrate 210, as the case may be. When all the transparent electrode shields 201 are applied with the same voltage, the whole surfaces of the first transparent conductive films 220 may also be formed on one side of the first transparent substrate 210 to reduce the manufacturing cost. When each transparent electrode shield 201 is independently applied with a voltage to independently control each electron microscope assembly 200, the first transparent conductive films 220 may be formed only on the surfaces of the convex areas 211.

The first transparent substrate 210 is provided with a plurality of convex areas 211 and a planar area 212 other than the convex areas 211, where a structure corresponding to each convex area 211 forms one transparent shield body, and the plurality of transparent electrode shields 201 are connected into a whole through the planar area 212, so that the electrolytes 230 are conveniently sealed and the structural strength of the backlight circuit is higher. In addition, the adjacent transparent electrode shields 201 are separated by the planar area 212, each transparent electrode shield 201 may be independently powered, the electrode plates 202 are connected into a whole, and all the electrode plates 202 are integrally powered. In such a design, not only is the structure of the backlight circuit simplified, but also the independent control of each electron microscope assembly 200 is realized.

The frame 270 is disposed around one edge of the first transparent substrate 210 and one edge of the second transparent substrate 250, and are hermetically connected with the first transparent substrate 210 and the second transparent substrate 250 so as to enclose a sealed cavity for accommodating the electrolytes 230.

The frame 270 is connected with the first transparent substrate 210 and the second transparent substrate 250, and the transparent electrode shields 201 and the electrolytes 230 are both positioned in the frame 270 to facilitate the sealing of the electrolytes 230, so as to prevent leakage of the electrolytes 230.

It should be noted that the frame 270 is connected with the first transparent substrate 210 and the second transparent substrate 250, but is not limited to this. One end, away from the second transparent substrate 250, of the frame 270 may also be connected with the driving substrate 110, as the case may be.

Figure 4:
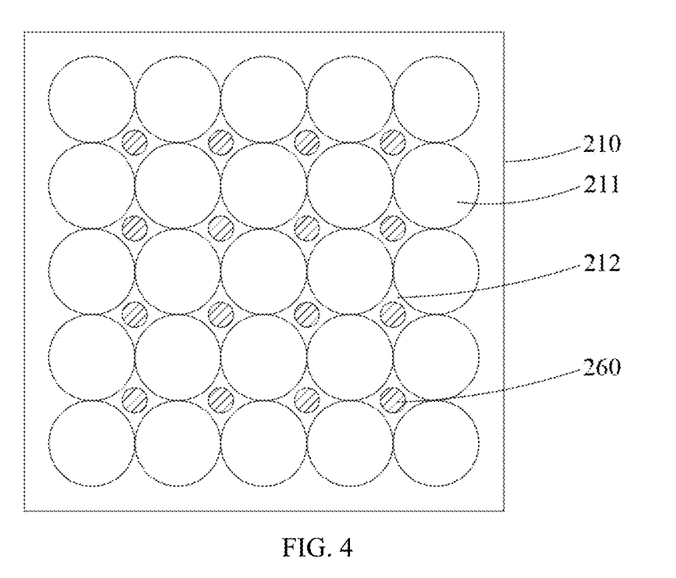
FIG. 4 is a cross-sectional view of a backlight circuit according to an Embodiment 1 of the present disclosure.

Referring to FIG. 1 and FIG. 4, the plurality of convex areas 211 are arranged in a plurality of rows, two adjacent convex areas 211 in each row are tangent to each other, and two adjacent rows of convex areas 211 are disposed oppositely and tangent to each other.

That is to say, the plurality of convex areas 211 are arranged in a row direction and a column direction, and the plurality of convex areas 211 in the same row are aligned in the middle and the plurality of concave areas 211 in the same column are aligned in the middle, that is, the convex areas 211 are arranged in a rectangular array. The convex areas 211 may be hemispherical bulges, and any one convex area 211 is tangent to two adjacent convex areas 211 in an adjacent row.

The plurality of convex areas 211 are arranged in a plurality of rows, two adjacent convex areas 211 in each row are tangent to each other, and two adjacent rows of convex areas 211 are disposed oppositely and tangent to each other. In such a design, the distances between the light-emitting chips 120 in the row direction and the column direction are equal, so that the uniformity of light emission of the backlight circuit is better.

Referring to FIG. 1 and FIG. 4, at least part of the planar area 212 is correspondingly provided with a support column 260, and the support column 260 is supported between the first transparent substrate 210 and the second transparent substrate 250. The cross-sectional shape of the support column 260 may be any shape, for example, the support column 260 may be a cylinder or a quadrangular prism. The support column 260 may be made of transparent plastic.

The support column 260 supports the first transparent substrate 210 and the second transparent substrate 250, and the areas between the first transparent substrate 210 and the second transparent substrate 250 can be uniform, so that the light emission of the backlight circuit can be prevented from being influenced by the bending of the first transparent substrate 210 and the second transparent substrate 250.

Embodiment 2

Figure 5:
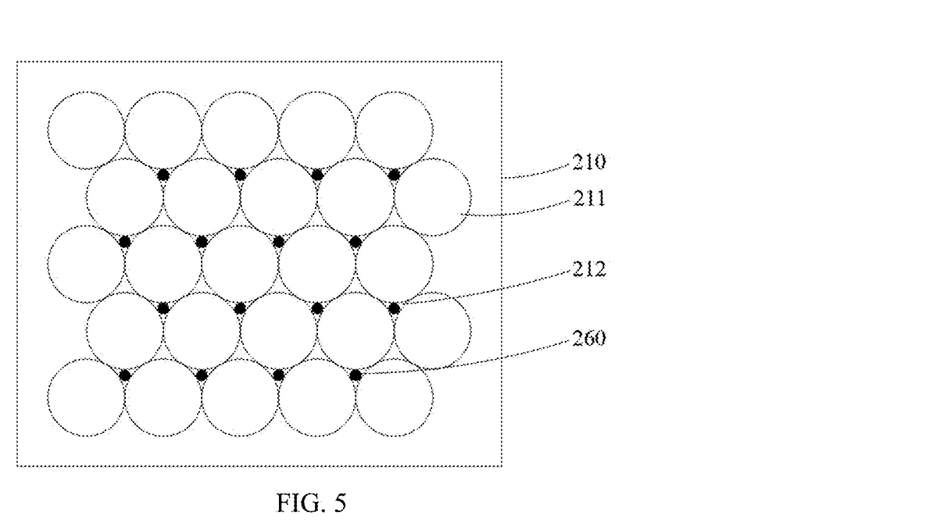
FIG. 5 is a cross-sectional view of a backlight circuit according to an Embodiment 2 of the present disclosure.

The difference between the Embodiment 2 and the Embodiment 1 is that the arrangement modes of convex areas 211 in a first transparent substrate 210 are different.

Referring to FIG. 5, the plurality of convex areas 211 are arranged in a plurality of rows, two adjacent rows of convex areas 211 are disposed in a staggered manner, and any two adjacent convex areas 211 are tangent to each other.

That is to say, the first transparent substrate 210 is provided with a plurality of convex areas 211 and a planar area 212 other than the convex areas 211. The plurality of convex areas 211 are arranged in a row direction and a column direction, and the plurality of convex areas 211 in the same row are aligned in the middle. The convex areas 211 may be hemispherical bulges, adjacent convex areas 211 in the same row may be tangent to each other, and adjacent convex areas 211 in the same column may be tangent to each other. The planar area 212 includes an area enclosed by three convex areas 211.

In the Embodiment 1, two adjacent convex areas 211 in each row are tangent to each other, two adjacent rows of convex areas 211 are disposed oppositely and are tangent to each other, and the distances between the light emitting chips 120 in the row direction and the column direction are equal. In the Embodiment 2, the two adjacent rows of the convex areas 211 are disposed in a staggered manner, any two adjacent convex areas 211 are tangent to each other, and the distances between the light-emitting chips 120 in the row direction and the column direction are not equal. Compared with the Embodiment 1, in the Embodiment 2, the distances between the adjacent light-emitting chips 120 in the column direction are smaller, and more light-emitting chips 120 may be disposed on the driving substrate 110 to improve the backlight brightness.

Embodiment 3

Figure 6:
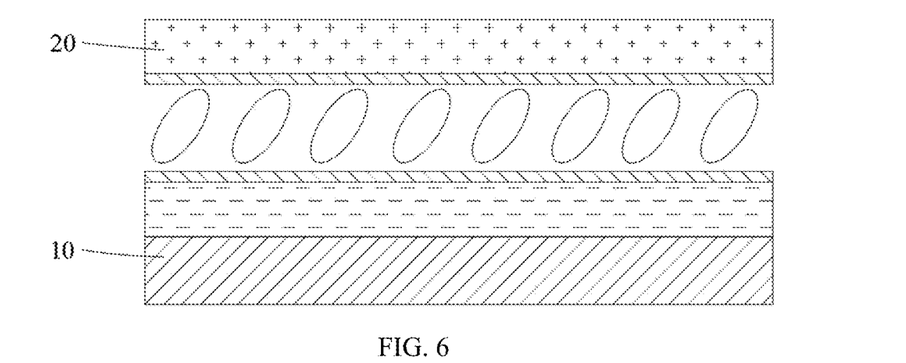
FIG. 6 is a schematic structural diagram of a displaying device according to an Embodiment 3 of the present disclosure.

Referring to FIG. 6, a displaying device in the embodiment includes a backlight circuit 10 and an LCD panel 20. The LCD panel 20 is disposed on a second side of the driving substrate 110, and the second side of the driving substrate 110 is disposed opposite to a first side of the driving substrate 110, that is, the LCD panel 20 is disposed on a light-emitting side of the backlight circuit 10. The backlight circuit 10 includes the backlight circuits 10 disclosed in the Embodiment 1 and the Embodiment 2. The LCD panel 20 includes an array substrate, an opposed substrate disposed opposite to the array substrate, and a liquid crystal layer between the array substrate and the opposed substrate. In addition, the displaying device may further include polarizers disposed on both sides of the LCD panel 20.

The displaying device includes a backlight circuit 10, a plurality of light-emitting chips 120 in the backlight circuit 10 are disposed on one side of a driving substrate 110 at intervals, electron microscope assemblies 200 correspond to the light-emitting chips 120 one by one and are disposed on sides, away from the driving substrate 110, of the light-emitting chips 120, the electron microscope assemblies 200 include transparent electrode shields 201, electrolytes 230, and electrode plates 202, the transparent electrode shields 201 are disposed on one side of the driving substrate 110, the light-emitting chips 120 are positioned in the transparent electrode shields 201, the electrode plates 202 are disposed on sides, away from the driving substrate 110, of the transparent electrode shields 201, and the electrolytes 230 are filled between the transparent electrode shields 201 and the electrode plates 202.

In the embodiment, the switching between the peep-proof displaying mode and the shared displaying mode is realized by switching the light emitted from the backlight circuit 10 into collimated light or the scattered light through the electron microscope assemblies 200. Light emitted from the backlight circuit 10 is not blocked and absorbed. Compared with the technical solution of realizing peep proofness by adopting dual cells, a peep-proof film and the like, the utilization rate of the light emitted from the backlight circuit is increased.

Embodiment 4

Figure 7:
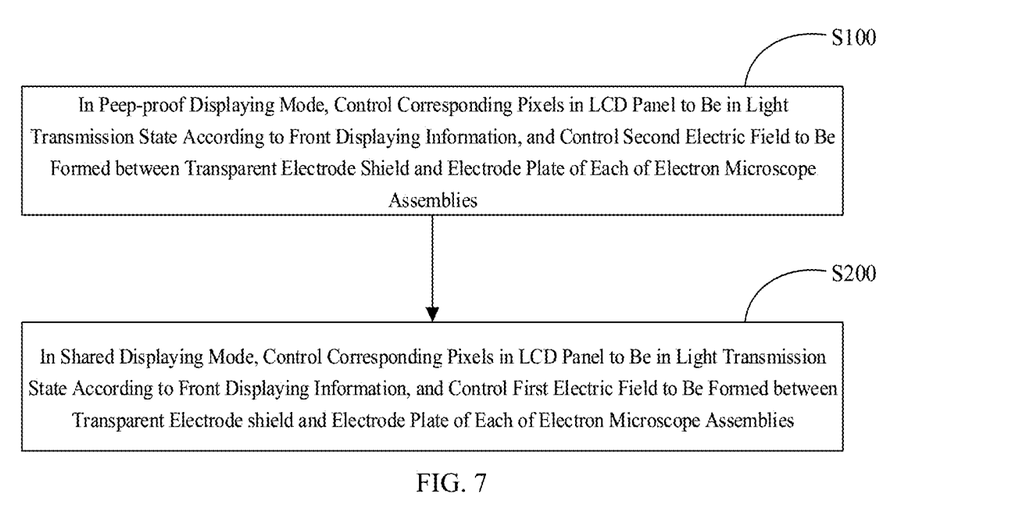
FIG. 7 is a flowchart of a displaying driving method according to an Embodiment 3 of the present disclosure.

Referring to FIG. 7, the displaying driving method in the embodiment is configured to drive the displaying device in the Embodiment 3, and the displaying device at least includes a peep-proof displaying mode and a shared displaying mode. The displaying driving method includes:

S100, in the peep-proof displaying mode, controlling corresponding pixels in the LCD panel 20 to be in a light transmission state according to front displaying information, and controlling a second electric field to be formed between the transparent electrode shield 201 and the electrode plate 202 of each of the electron microscope assemblies 200; and S200, in the shared displaying mode, controlling corresponding pixels in the LCD panel 20 to be in a light transmission state according to the front displaying information, and controlling a first electric field to be formed between the transparent electrode shield 201 and the electrode plate 202 of each of the electron microscope assemblies 200.

Referring to FIG. 2 and FIG. 3, when the backlight circuit 10 is in the peep-proof displaying mode, the light emitted downward from the light-emitting chips 120 will be propagated according to the principle of the shortest route, and then is reflected by the metal reflective films formed on the surfaces of the cup-shaped transparent electrode shields 201, such that parallel collimated light is emitted upward, and after the collimated light is emitted from the LCD panel 20, a displayed image can be seen only in a front view, and the displayed image cannot be seen in a squint view, so that the peep-proof displaying effect is achieved.

When the displaying device is switched from the peep-proof displaying mode to the shared displaying mode, the polarities of the voltages applied between the transparent electrode shields 201 and the electrode plates 202 may be switched, so that the metal reflective films on the surfaces of the transparent electrode shields 201 will lose electrons and become metal ions to return to the electrolyte 230 again, and the metal ions will form metal reflective films on the surfaces of the electrode plates 202 with the continuous action of the electric fields. At this time, the light emitted downward from the light-emitting chip 120 will pass through the transparent electrode shield 201 that transmit light, and is reflected by the reflective films on the surfaces of the electrode plates 202 to be propagated upward in the form of a surface light source. The emitted light is scattered light emitted from all directions, and the displayed image can be seen in a front view or a squint view after the scattered light is emitted from the LCD panel 20.

In the embodiment, the switching between the peep-proof displaying mode and the shared displaying mode is realized by switching the light emitted from the backlight circuit 10 into collimated light or the scattered light through the electron microscope assemblies 200. Light emitted from the backlight circuit 10 is not blocked and absorbed. Compared with the technical solution of realizing peep proofness by adopting dual cells, a peep-proof film and the like, the utilization rate of the light emitted from the backlight circuit is increased.

In some embodiments, the transparent electrode shield 201 of each of the electron microscope assemblies 200 is controlled independently from each other, and the electrode plates 202 are of a transparent structure.

When the transparent electrode shields 201 of the electron microscope assemblies 200 are controlled independently of each other, the displaying device further has a back displaying mode and a back mirror surface mode, one side of the LCD panel 20 of the displaying device is the front side, one side of the backlight circuit 10 is the back side, information can be displayed on the back side of the displaying device in the back displaying mode, and in the back mirror surface mode, the back side of the displaying device may serve as a mirror surface.

Figure 8:
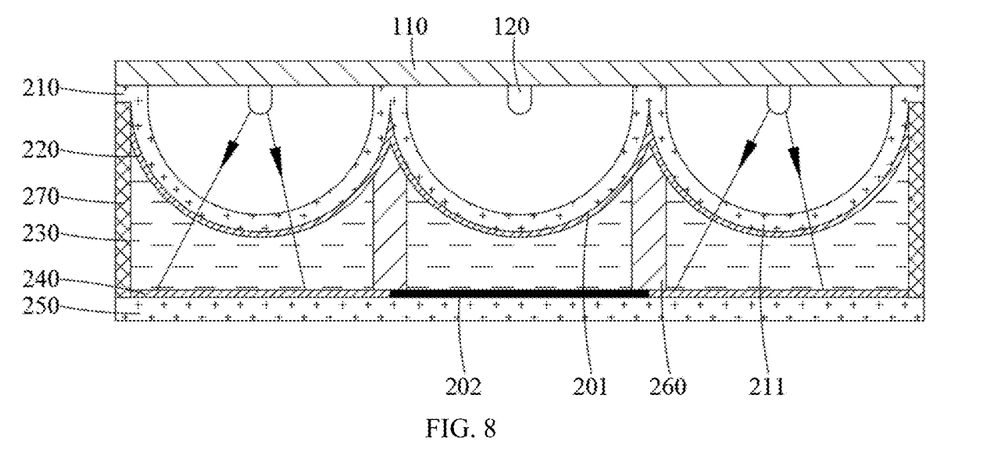
FIG. 8 is a schematic diagram of a backlight circuit in a back displaying mode according to an embodiment of the present disclosure.
Figure 9:
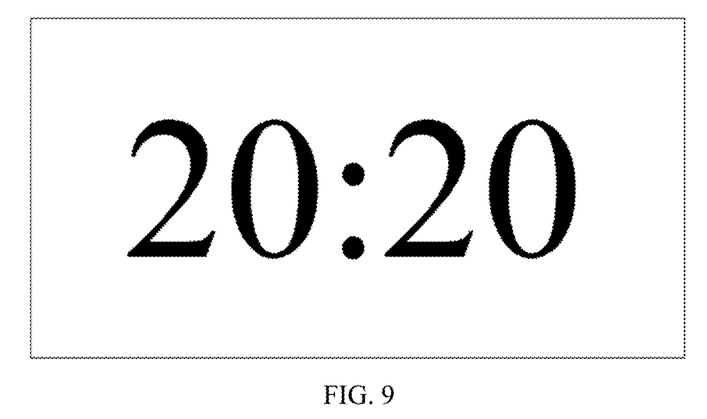
FIG. 9 is a schematic diagram of a back displayed image of a displaying device according to an embodiment of the present disclosure.

Specifically, referring to FIG. 8 and FIG. 9, in the back displaying mode, each pixel in the LCD panel 20 is controlled to be in a non-transparent state, the transparent electrode shield 201 and the electrode plate 202 in the electron microscope assembly at a corresponding position are controlled to be in an unpowered state according to the back displaying information, and the transparent electrode shields 201 and the electrode plates 202 in the electron microscope assemblies 200 at remaining positions are controlled to be in a corresponding powered state to form the first electric field or the second electric field.

Electric fields are applied to the transparent electrode shields 201 and the electrode plates 202 of the parts of the electron microscope assemblies 200 to drive the metal ions to form metal reflective films on the surfaces of the powered part of the electrode plates 202. Metal generating films are formed on the surfaces of the electrode plates 202 of the parts of the electron microscope assemblies 200, and both the transparent electrode shields 201 and the electrode plates 202 of the parts of the electron microscope assemblies 200 are transparent. After the light-emitting chips 120 corresponding to the unpowered parts of the electron microscope assemblies 200 are turned on, the light emitted from the light-emitting chips 120 may pass through the transparent electrode plates 202, and the electrode plates 202 are controlled to be transparent or non-transparent according to the displaying information, so as to realize the back displaying of the displaying device.

Figure 10:
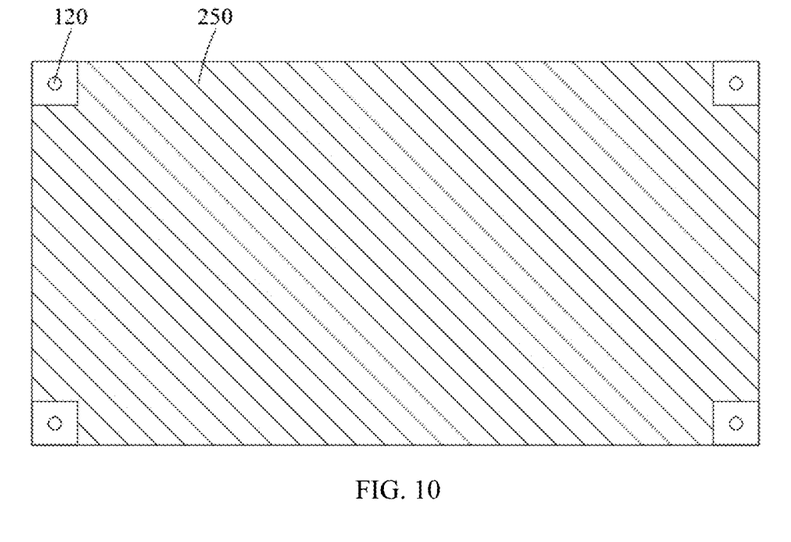
FIG. 10 is a schematic diagram of a backlight circuit in a back mirror surface mode according to an embodiment of the present disclosure.

The displaying device further includes a back mirror surface mode, and in the back mirror surface mode, each pixel in the LCD panel 20 is controlled to be in a non-transparent state, and a first electric field is at least controlled to be formed between the transparent electrode shield 201 and the electrode plate 202 of each of the electron microscope assemblies 200 in a central area, as shown in FIG. 10.

In the back mirror surface mode, electric fields are applied to the transparent electrode shields 201 and the electrode plates 202 of the parts of the electron microscope assemblies 200 in the central area to drive the metal ions to form metal reflective films on the surfaces of the powered parts of the electrode plates 202, so that the second transparent substrate 250 becomes a mirror surface, and the back side of the displaying device can be used as a dressing mirror. Meanwhile, the transparent electrode shields 201 and the electrode plates 202 of the unpowered parts of the electron microscope assemblies 200 are transparent, and the light-emitting chips 120 corresponding to the unpowered parts of the electron microscope assemblies 200 are turned on to fill light on the back side.

Besides, the displaying device further includes a subarea peep-proof displaying mode, and in the subarea peep-proof displaying mode, corresponding pixels in the LCD panel 20 are controlled to be in a light transmission state according to the front displaying information, a second electric field is controlled to be formed between the transparent electrode shield 201 and the electrode plate 202 of each of the corresponding electron microscope assemblies 200 in a peep-proof area, and a first electric field is controlled to be formed between the transparent electrode shield 201 and the electrode plate 202 of each of the corresponding electron microscope assemblies 200 in a non-peep-proof area.

By controlling the transparent electrode shields 201 of the electron microscope assemblies 200 to be independently of each other, the displaying device realizes a subarea peep-proof displaying mode, a back displaying mode, and a back mirror surface mode, thereby having more diversified functions.

The terms "first", "second", etc. are used for descriptive purposes only and are not to be construed as indicating or implying relative importance or as implying a quantity of the indicated technical features. Thus, the features defined as "first", "second", etc may explicitly or implicitly include one or more of the features. In the description of the present disclosure, "a plurality" means two or more unless specifically defined otherwise.

In the present disclosure, unless otherwise expressly defined and limited, the terms "assembly", "connection" and the like are to be construed broadly, for example, as a fixed connection, a detachable connection, an integral connection, a mechanical connection, an electrical connection a direct connection, an indirect connection through an intermediate medium, or an internal communication of two components or an interaction relationship of two components. For those of ordinary skill in the art, the specific meanings of the above terms in the present disclosure may be understood according to specific circumstances.

In the description of this specification, reference to descriptions of the terms "some embodiments," "exemplarily," etc., mean that a particular feature, structure, material, or characteristic described in connection with the embodiment or example is included in at least one embodiment or example of the present disclosure. In the present specification, schematic expressions of the above terms are not necessarily directed to the same embodiment or example. Moreover, the particular features, structures, materials, or characteristics described may be combined in a suitable manner in any one or more embodiments or examples. Furthermore, different embodiments or examples and features of different embodiments or examples described in this specification may be combined and incorporated by those skilled in the art without being mutually contradictory.

Although the embodiments of the present disclosure have been shown and described above, it should be understood that the above embodiments are exemplary and not to be construed as limiting the present disclosure, and those of ordinary skill in the art may make changes, modifications, substitutions, and alterations to the above embodiments within the scope of the present disclosure, and therefore any changes or modifications made in accordance with the claims and the specification of the present disclosure shall fall within the scope of the patent of the present disclosure.

What is claimed is:

1. A backlight circuit, comprising a lamp panel, the lamp panel comprising a driving substrate and a plurality of light-emitting chips, and the plurality of light-emitting chips being disposed on one side of the driving substrate at intervals, wherein the backlight circuit further comprises a plurality of electron microscope assemblies, the plurality of electron microscope assemblies being disposed on light-emitting sides of the plurality of light-emitting chips in a one-to-one correspondence manner;

wherein the plurality of electron microscope assemblies comprise transparent electrode shields, electrolytes and electrode plates, the transparent electrode shields being disposed on a first side of the driving substrate and being a cup-shaped structure that converge, after forming a reflective film on a surface, divergent light emitted from the plurality of light-emitting chips, the plurality of light-emitting chips being positioned in the transparent electrode shields, the electrode plates being disposed on sides, away from the driving substrate, of the transparent electrode shields, the electrolytes being filled between the transparent electrode shields and the electrode plates, and the electrolytes containing metal ions;

wherein first electric fields or second electric fields are capable of being formed between the transparent electrode shields and the electrode plates, and directions of the first electric fields are opposite to those of the second electric fields;

wherein under an action of the first electric fields, the metal ions of the electrolytes are capable of forming first metal reflective films on surfaces of the electrode plates, and the divergent light emitted from the plurality of light-emitting chips passes through the transparent electrode shield and the electrolytes and is reflected by the first metal reflective films, such that the divergent light is emitted through the transparent electrode shield and the electrolytes toward the driving substrate; and under an action of the second electric fields, the metal ions of the electrolytes are capable of forming second metal reflective films on surfaces of the transparent electrode shields, and the divergent light emitted from the plurality of light-emitting chips passes through the transparent electrode shield and is reflected and converged by the second metal reflective films, such that parallel collimated light is emitted through the transparent electrode shield toward the driving substrate.

2. The backlight circuit according to claim 1, wherein the surfaces, facing the electrode plates, of the transparent electrode shields are hemispherical surfaces or parabolic surfaces, and positions of the plurality of light-emitting chips coincide with focus positions of the transparent electrode shields.

3. The backlight circuit according to claim 1, wherein the transparent electrode shields comprise transparent shield bodies and first transparent conductive films, the plurality of light-emitting chips being positioned in the transparent shield bodies, and the first transparent conductive films covering the surfaces, facing the electrode plates, of the transparent shield bodies;

the electrode plates comprise transparent matrices and second transparent conductive films formed on the sides, facing the transparent electrode shields, of the transparent matrices, and the second transparent conductive films being disposed on the transparent electrode shields in a one-to-one correspondence manner; and the electrolytes are filled between the first transparent conductive films and the second transparent conductive films.

4. The backlight circuit according to claim 3, wherein the backlight circuit comprises:

a first transparent substrate provided with a plurality of convex areas and a planar area other than the plurality of convex areas, wherein a structure corresponding to each of the plurality of convex areas forms one of the transparent shield bodies;

a second transparent substrate positioned on one side, away from the plurality of light-emitting chips, of the first transparent substrate, wherein areas, corresponding to the plurality of convex areas, of the second transparent substrate are defined as the transparent matrices; and a frame disposed around one edge of the first transparent substrate and one edge of the second transparent substrate, and hermetically connected with the first transparent substrate and the second transparent substrate so as to enclose a sealed cavity for accommodating the electrolytes.

5. The backlight circuit according to claim 4, wherein the plurality of convex areas are disposed in a plurality of rows, and two adjacent ones of the plurality of convex areas in each row are tangent to each other, wherein:

two adjacent rows of the plurality of convex areas are disposed oppositely and tangent to each other, or two adjacent rows of the plurality of convex areas are disposed in a staggered manner, and any two adjacent convex areas are tangent to each other.

6. The backlight circuit according to claim 4, wherein at least part of the planar area is correspondingly provided with a support column, and the support column is supported between the first transparent substrate and the second transparent substrate.

7. A displaying device, comprising:

a backlight circuit; and an LCD panel disposed on a second side of a driving substrate, where the second side of the driving substrate is disposed opposite to a first side of the driving substrate;

wherein the backlight circuit comprises a lamp panel comprising the driving substrate and a plurality of light-emitting chips, and the plurality of light-emitting chips being disposed on one side of the driving substrate at intervals, wherein the backlight circuit further comprises a plurality of electron microscope assemblies, the plurality of electron microscope assemblies being disposed on light-emitting sides of the plurality of light-emitting chips in a one-to-one correspondence manner;

wherein the plurality of electron microscope assemblies comprise transparent electrode shields, electrolytes and electrode plates, the transparent electrode shields being disposed on the first side of the driving substrate and being a cup-shaped structure that converge, after forming a reflective film on a surface, divergent light emitted from the plurality of light-emitting chips, the plurality of light-emitting chips being positioned in the transparent electrode shields, the electrode plates being disposed on sides, away from the driving substrate, of the transparent electrode shields, the electrolytes being filled between the transparent electrode shields and the electrode plates, and the electrolytes containing metal ions;

wherein first electric fields or second electric fields are capable of being formed between the transparent electrode shields and the electrode plates, and directions of the first electric fields are opposite to those of the second electric fields;

wherein under an action of the first electric fields, the metal ions of the electrolytes are capable of forming first metal reflective films on surfaces of the electrode plates, and the divergent light emitted from the plurality of light-emitting chips passes through the transparent electrode shield and the electrolytes and is reflected by the first metal reflective films, such that the divergent light is emitted through the transparent electrode shield and the electrolytes toward the driving substrate; and under an action of the second electric fields, the metal ions of the electrolytes are capable of forming second metal reflective films on the surfaces of the transparent electrode shields, and the divergent light emitted from the plurality of light-emitting chips passes through the transparent electrode shield and is reflected and converged by the second metal reflective films, such that parallel collimated light is emitted through the transparent electrode shield toward the driving substrate.

8. The displaying device according to claim 7, wherein the surfaces, facing the electrode plates, of the transparent electrode shields are hemispherical surfaces or parabolic surfaces, and positions of the plurality of light-emitting chips coincide with focus positions of the transparent electrode shields.

9. The displaying device according to claim 7, wherein the transparent electrode shields comprise transparent shield bodies and first transparent conductive films, the plurality of light-emitting chips being positioned in the transparent shield bodies, and the first transparent conductive films covering the surfaces, facing the electrode plates, of the transparent shield bodies;
the electrode plates comprise transparent matrices and second transparent conductive films formed on the sides, facing the transparent electrode shields, of the transparent matrices, and the second transparent conductive films being disposed on the transparent electrode shields in a one-to-one correspondence manner; and
the electrolytes are filled between the first transparent conductive films and the second transparent conductive films.

10. The displaying device according to claim 9, wherein the backlight circuit comprises:
a first transparent substrate provided with a plurality of convex areas and a planar area other than the plurality of convex areas, wherein a structure corresponding to each of the plurality of convex areas forms one of the transparent shield bodies;
a second transparent substrate positioned on one side, away from the plurality of light-emitting chips, of the first transparent substrate, wherein areas, corresponding to the plurality of convex areas, of the second transparent substrate are defined as the transparent matrices; and
a frame disposed around one edge of the first transparent substrate and one edge of the second transparent substrate, and hermetically connected with the first transparent substrate and the second transparent substrate so as to enclose a sealed cavity for accommodating the electrolytes.

11. The displaying device according to claim 10, wherein the plurality of convex areas are disposed in a plurality of rows, and two adjacent ones of the plurality of convex areas in each row are tangent to each other, wherein:
two adjacent rows of the plurality of convex areas are disposed oppositely and tangent to each other, or
two adjacent rows of the plurality of convex areas are disposed in a staggered manner, and any two adjacent convex areas are tangent to each other.

12. The displaying device according to claim 10, wherein at least part of the planar area is correspondingly provided with a support column, and the support column is supported between the first transparent substrate and the second transparent substrate.

13. A displaying driving method, wherein the displaying driving method is configured to drive a displaying device, and the displaying device at least comprises a peep-proof displaying mode and a shared displaying mode, wherein the displaying device comprises:
a backlight circuit; and
an LCD panel disposed on a second side of a driving substrate, where the second side of the driving substrate is disposed opposite to a first side of the driving substrate; wherein the backlight circuit comprises a lamp panel comprising the driving substrate and a plurality of light-emitting chips, and the plurality of light-emitting chips being disposed on one side of the driving substrate at intervals, wherein the backlight circuit further comprises a plurality of electron microscope assemblies, the plurality of electron microscope assemblies being disposed on light-emitting sides of the plurality of light-emitting chips in a one-to-one correspondence manner;
wherein the plurality of electron microscope assemblies comprise transparent electrode shields, electrolytes and electrode plates, the transparent electrode shields being disposed on the first side of the driving substrate and being a cup-shaped structure that converge, after forming a reflective film on a surface, divergent light emitted from the plurality of light-emitting chips, the plurality of light-emitting chips being positioned in the transparent electrode shields, the electrode plates being disposed on sides, away from the driving substrate, of the transparent electrode shields, the electrolytes being filled between the transparent electrode shields and the electrode plates, and the electrolytes containing metal ions;
wherein first electric fields or second electric fields are capable of being formed between the transparent electrode shields and the electrode plates, and directions of the first electric fields are opposite to those of the second electric fields; wherein under an action of the first electric fields, the metal ions of the electrolytes are capable of forming first metal reflective films on surfaces of the electrode plates, and the divergent light emitted from the plurality of light-emitting chips passes through the transparent electrode shield and the electrolytes and is reflected by the first metal reflective films, such that the divergent light is emitted through the transparent electrode shield and the electrolytes toward the driving substrate; and
under an action of the second electric fields, the metal ions of the electrolytes are capable of forming second metal reflective films on the surfaces of the transparent electrode shields, and the divergent light emitted from the plurality of light-emitting chips passes through the transparent electrode shield and is reflected and converged by the second metal reflective films, such that parallel collimated light is emitted through the transparent electrode shield toward the driving substrate;
wherein the displaying driving method comprises:
in the peep-proof displaying mode, controlling corresponding pixels in the LCD panel to be in a light transmission state according to front displaying information, and controlling a second electric field to be formed between the transparent electrode shields and the electrode plates of each of the plurality of electron microscope assemblies; and
in the shared displaying mode, controlling corresponding pixels in the LCD panel to be in the light transmission state according to the front displaying information, and controlling a first electric field to be formed between the transparent electrode shields and the electrode plates of each of the plurality of electron microscope assemblies.

14. The displaying driving method according to claim 13, wherein the transparent electrode shields of the plurality of electron microscope assemblies are controlled independently of each other, and the electrode plates are of a transparent structure.

15. The displaying driving method according to claim 14, wherein:
the displaying device further comprises a subarea peep-proof displaying mode, and in the subarea peep-proof displaying mode, corresponding pixels in the LCD panel are controlled to be in the light transmission state according to the front displaying information, the second electric field is controlled to be formed between the transparent electrode shields and the electrode plates of each of the corresponding electron microscope assemblies in a peep-proof area, and the first electric field is controlled to be formed between the transparent electrode shields and the electrode plates of each of the corresponding electron microscope assemblies in a non-peep-proof area;
the displaying device further comprises a back displaying mode, and in the back displaying mode, each pixel in the LCD panel is controlled to be in a non-transparent state, the transparent electrode shield and the electrode plate in the electron microscope assembly at a corresponding position are controlled to be in an unpowered state according to back displaying information, and the transparent electrode shields and the electrode plates in the plurality of electron microscope assemblies at remaining positions are controlled to be in a corresponding powered state to form the first electric fields or the second electric fields; and
the displaying device further comprises a back mirror surface mode, and in the back mirror surface mode, each pixel in the LCD panel is controlled to be in the non-transparent state, and the first electric field is at least controlled to be formed between the transparent electrode shields and the electrode plates of each of the plurality of electron microscope assemblies in a central area.

16. The displaying driving method according to claim 14, wherein the displaying device further comprises a subarea peep-proof displaying mode, and in the subarea peep-proof displaying mode, corresponding pixels in the LCD panel are controlled to be in the light transmission state according to the front displaying information, the second electric field is controlled to be formed between the transparent electrode shields and the electrode plates of each of the corresponding electron microscope assemblies in a peep-proof area, and the first electric field is controlled to be formed between the transparent electrode shields and the electrode plates of each of the corresponding electron microscope assemblies in a non-peep-proof area.

17. The displaying driving method according to claim 14, wherein the displaying device further comprises a back displaying mode, and in the back displaying mode, each pixel in the LCD panel is controlled to be in a non-transparent state, the transparent electrode shield and the electrode plate in the electron microscope assembly at a corresponding position are controlled to be in an unpowered state according to back displaying information, and the transparent electrode shields and the electrode plates in the plurality of electron microscope assemblies at remaining positions are controlled to be in a corresponding powered state to form the first electric fields or the second electric fields.

18. The displaying driving method according to claim 14, wherein the displaying device further comprises a back mirror surface mode, and in the back mirror surface mode, each pixel in the LCD panel is controlled to be in a non-transparent state, and the first electric field is at least controlled to be formed between the transparent electrode shields and the electrode plates of each of the plurality of electron microscope assemblies in a central area.

19. The displaying driving method according to claim 14, wherein:
the displaying device further comprises a subarea peep-proof displaying mode, and in the subarea peep-proof displaying mode, corresponding pixels in the LCD panel are controlled to be in the light transmission state according to the front displaying information, the second electric field is controlled to be formed between the transparent electrode shields and the electrode plates of each of the corresponding electron microscope assemblies in a peep-proof area, and the first electric field is controlled to be formed between the transparent electrode shields and the electrode plates of each of the corresponding electron microscope assemblies in a non-peep-proof area;
the displaying device further comprises a back displaying mode, and in the back displaying mode, each pixel in the LCD panel is controlled to be in a non-transparent state, the transparent electrode shield and the electrode plate in the electron microscope assembly at a corresponding position are controlled to be in an unpowered state according to back displaying information, and the transparent electrode shields and the electrode plates in the plurality of electron microscope assemblies at remaining positions are controlled to be in a corresponding powered state to form the first electric fields or the second electric fields; and
the displaying device further comprises a back mirror surface mode, and in the back mirror surface mode, each pixel in the LCD panel is controlled to be in the non-transparent state, and the first electric field is at least controlled to be formed between the transparent electrode shields and the electrode plates of each of the plurality of electron microscope assemblies in a central area.

* * * * *